(12) United States Patent
Igarashi

(10) Patent No.: US 10,672,640 B2
(45) Date of Patent: Jun. 2, 2020

(54) SEMICONDUCTOR PROCESSING APPARATUS AND SEMICONDUCTOR PROCESSING METHOD

(71) Applicant: TOSHIBA MEMORY CORPORATION, Minato-ku (JP)

(72) Inventor: Junichi Igarashi, Nagoya (JP)

(73) Assignee: TOSHIBA MEMORY CORPORATION, Minato-ku (JP)

(*) Notice: Subject to any disclaimer, the term of this patent is extended or adjusted under 35 U.S.C. 154(b) by 0 days.

(21) Appl. No.: 16/059,213

(22) Filed: Aug. 9, 2018

(65) Prior Publication Data

US 2019/0252236 A1  Aug. 15, 2019

(30) Foreign Application Priority Data

Feb. 9, 2018  (JP) ................. 2018-021645

(51) Int. Cl.
| | | |
|---|---|---|
| *H01L 21/00* | (2006.01) | |
| *H01L 21/687* | (2006.01) | |
| *B05B 13/02* | (2006.01) | |
| *B05C 11/02* | (2006.01) | |
| *B05C 11/10* | (2006.01) | |
| *H01L 21/67* | (2006.01) | |

(52) U.S. Cl.
CPC .... *H01L 21/68742* (2013.01); *B05B 13/0228* (2013.01); *B05C 11/023* (2013.01); *B05C 11/1002* (2013.01); *H01L 21/6708* (2013.01); *H01L 21/67051* (2013.01); *H01L 21/67259* (2013.01); *H01L 21/68728* (2013.01); *H01L 21/68792* (2013.01)

(58) Field of Classification Search
CPC ......... H01L 21/68742; H01L 21/67051; H01L 21/6708; H01L 21/68792; B05C 11/023; B05C 11/1002; B05B 13/0228
See application file for complete search history.

(56) References Cited

U.S. PATENT DOCUMENTS

| | | | | |
|---|---|---|---|---|
| 6,113,165 A | * | 9/2000 | Wen | ......... H01L 21/68707 294/213 |
| 8,899,172 B2 | | 12/2014 | Hashimoto | |
| 9,630,200 B2 | | 4/2017 | Hashimoto | |
| 2008/0189975 A1 | * | 8/2008 | Miya | ......... H01L 21/68728 34/317 |

FOREIGN PATENT DOCUMENTS

| | | |
|---|---|---|
| JP | 4080319 | 4/2008 |
| JP | 5355179 | 11/2013 |
| JP | 5726686 | 6/2015 |

* cited by examiner

*Primary Examiner* — Kimberly N Rizkallah
*Assistant Examiner* — Alexander Belousov
(74) *Attorney, Agent, or Firm* — Oblon, McClelland, Maier & Neustadt, L.L.P.

(57) ABSTRACT

A semiconductor processing apparatus according to the present embodiment is provided with a stage capable of placing a semiconductor substrate thereon and of rotating the semiconductor substrate. A plurality of holders are provided on the stage, to hold an edge of the semiconductor substrate. A plurality of sensors are provided to the plurality of holders, respectively, to detect the edge of the semiconductor substrate. An elevator mechanism is capable of changing heights of the holders. A controller controls the elevator mechanism to change the heights of the holders so that the plurality of sensors detect the edge of the semiconductor substrate.

12 Claims, 3 Drawing Sheets

SEMICONDUCTOR PROCESSING APPARATUS AND SEMICONDUCTOR PROCESSING METHOD

CROSS REFERENCE TO RELATED APPLICATIONS

This application is based upon and claims the benefit of priority from the prior Japanese Patent Application No. 2018-021645, filed on Feb. 9, 2018, the entire contents of which are incorporated herein by reference.

FIELD

The embodiments of the present invention relate to a semiconductor processing apparatus and a semiconductor processing method.

BACKGROUND

Semiconductor devices, such as a NAND EPROM (Electrically Erasable Programmable Read-Only Memory), with a three-dimensionally laminated three-dimensional configuration, have been developed. Such semiconductor devices with the three-dimensional configuration require lamination of many materials, and hence suffer larger warpage than flat semiconductor devices.

Warpage tolerance of semiconductor substrates processable by a single-wafer cleaning apparatus is set based on a gap between chuck pins for holding a semiconductor substrate and a stage. Therefore, when the warpage of the semiconductor substrate exceeds the warpage tolerance, the cleaning apparatus cannot process the semiconductor substrate.

DETAILED DESCRIPTION

Embodiments will now be explained with reference to the accompanying drawings. The present invention is not limited to the embodiments. The drawings are schematic or conceptual, the scale and the like of each part thereof being not necessarily the same as actual ones. In the specification and drawings, the same signs are given to the same elements as those described with reference to the drawings previously shown, a detailed description thereof being omitted, as required.

A semiconductor processing apparatus according to the present embodiment is provided with a stage capable of placing a semiconductor substrate thereon and of rotating the semiconductor substrate. A plurality of holders are provided on the stage, to hold an edge of the semiconductor substrate. A plurality of sensors are provided to the plurality of holders, respectively, to detect the edge of the semiconductor substrate. An elevator mechanism is capable of changing heights of the holders. A controller controls the elevator mechanism to change the heights of the holders so that the plurality of sensors detect the edge of the semiconductor substrate.

Figure 1:
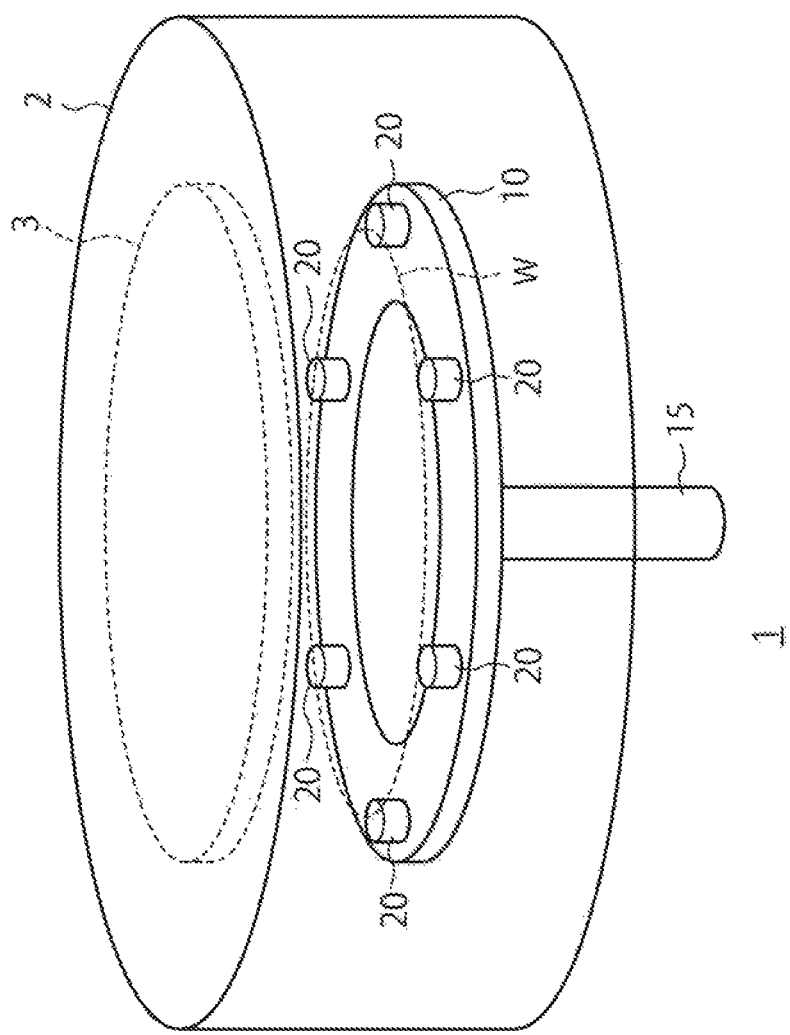
FIG. 1 is a schematic view showing a configuration example of a semiconductor cleaning apparatus 1 according to the present embodiment.

FIG. 1 is a schematic view showing a configuration example of a semiconductor cleaning apparatus 1 according to the present embodiment. The semiconductor cleaning apparatus (also merely referred to as a cleaning apparatus, hereinafter) 1, as a semiconductor processing apparatus, is a single-wafer cleaning apparatus 1, provided with a chamber 2 capable of accommodating a semiconductor substrate W and a chemical solution supplier 3 for supplying a chemical solution to the semiconductor substrate W. A material such as stainless steel anticorrosive to the chemical solution is used for the chamber 2 which is decompressive inside. The chemical solution supplier 3 is provided above, inside the chamber 2, to supply the chemical solution toward the semiconductor substrate W.

The present embodiment is not limited to the cleaning apparatus 1, but applicable to a single-wafer semiconductor processing apparatus, such as, a wet etching apparatus, a dry etching apparatus, and a film forming apparatus.

The cleaning apparatus 1 is provided with a stage 10 and chuck pins 20. The stage 10 has a circular upper surface on which the semiconductor substrate W can be placed, upward inside the chamber 2. To the center of the stage 10, a shaft 15 is connected, so that the stage 10 is rotatable about the shaft 15. The stage 10 may be configured to spray air or supply a chemical solution.

A plurality of chuck pins 20 as a holder are provided on the stage 10. The plurality of chuck pins 20 are arranged at a roughly constant interval along the outer edge of the upper surface of the stage 10. There are at least three chuck pins 20 in order to hold (chuck) the edge of the semiconductor substrate W. In the present embodiment, six chuck pins 20 are arranged at a roughly constant interval along the outer edge of the upper surface of the stage 10.

The chuck pins 20 may, for example, be any one of a vacuum chuck, an electrostatic chuck, and a spin chuck. The material used for the chuck pins 20 is, for example, stainless steel that is anticorrosive to the chemical solution.

Figure 2:
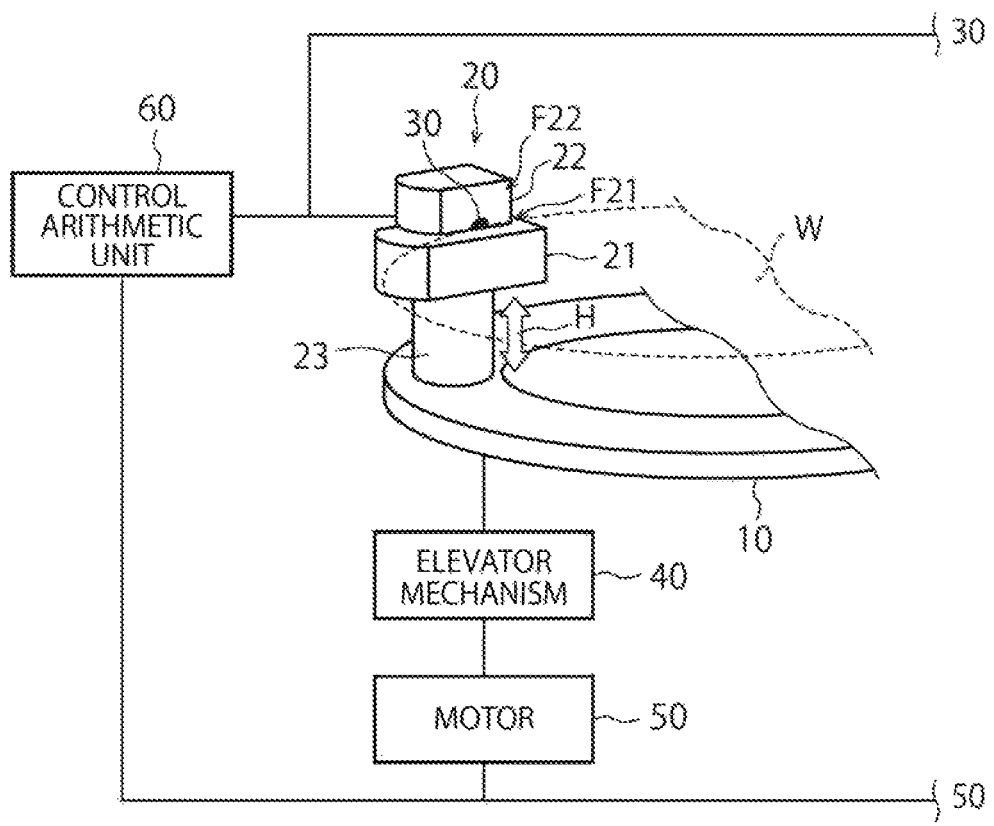
FIG. 2 is a diagram showing a configuration example of a chuck pin and a cleaning apparatus according to the present embodiment.

FIG. 2 is a diagram showing a configuration example of each chuck pin 20 and the cleaning apparatus 1 according to the present embodiment. The chuck pin 20 is provided with a first support 21, a second support 22, and an elevator shaft 23.

The first support 21 has a support face F21 that is roughly parallel (roughly horizontal) with the upper surface of the stage 10. The edge of the semiconductor substrate W is placed on the support face F21. In this way, the first support 21 supports the edge of the semiconductor substrate W from below, so that the semiconductor substrate W does not have contact with the upper surface of the stage 10.

The second support 22 has a support face F22 that is roughly orthogonal to the upper surface of the stage 10. The side face (bevel) of the semiconductor substrate W has contact with the support face F22. In this way, the second support 22 supports the edge of the semiconductor substrate W laterally, so that the semiconductor substrate W is not detached in the lateral direction to fly out while the semiconductor substrate W is being rotated on the stage 10.

Having three or more number of chuck pins 20 arranged at a roughly constant interval along the outer periphery of the stage 10, the second supports 22 of the chuck pins 20 support the semiconductor substrate W from at least three directions to restrict the semiconductor substrate W from flying out due to the centrifugal force.

The elevator shaft 23 is connected to the bottom surface of the first support 21 and also connected to an elevator mechanism 40 located under the stage 10. The elevator shaft 23 is driven by the elevator mechanism 40 to move the first and second supports 21 and 22 in a roughly orthogonal direction (roughly vertical direction) to the upper surface of the stage 10. The first and second supports 21 and 22, and the elevator shaft 23 may be assembled together after they are formed separately. Or two or more of the first and second supports 21 and 22, and the elevator shaft 23 may be formed integrally.

The cleaning apparatus 1 is provided further with a sensor 30, the elevator mechanism 40, a motor 50, and a control arithmetic unit 60.

The sensor 30 is provided to the second support 22 of each of the plurality of chuck pins 20, to detect whether the edge of the semiconductor substrate W is present on the first support 21. The sensor 30 may, for example, be an optical sensor that radiates light to detect reflected light reflected on the edge of the semiconductor substrate W. In this case, the sensor 30 is provided with a light emitter and a light receiver (both not shown). The light emitter of the sensor 30 is disposed at a lower end of the second support 22, to emit light in a roughly parallel direction (roughly horizontal direction) to the upper surface of the stage 10. When the semiconductor substrate W is present on the support face F21 of the first support 21, light from the light emitter is reflected on the side face (bevel) of the semiconductor substrate W and then its reflected light is received by the light receiver of the sensor 30. The light receiver of the sensor 30 receives the reflected light from the semiconductor substrate W to convert the intensity of the reflected light into an electric signal by photoelectric conversion and sends the electric signal to the control arithmetic unit 60. On the other hand, when the semiconductor substrate W is not present on the support face F21 of the first support 21, the light from the light emitter is scattered inside the chamber 2, without being reflected on the side face (bevel) of the semiconductor substrate W. Therefore, almost no reflected light from the semiconductor substrate W is detected by the light receiver of the sensor 30.

The sensor 30 may, for example, be a pressure sensor that detects pressure caused by the semiconductor substrate W's own weight. In this case, the sensor 30 may, for example, be a piezoelectric transducer (not shown) such as a piezoelectric element. The sensor 30 is disposed on the support face F21 of the first support 21, to detect whether the semiconductor substrate W is present on the support face F21 of the first support 21. In this case, when the edge of the semiconductor substrate W is placed on the support face F21 of the first support 21, the sensor 30 performs piezoelectric conversion due to the weight of the semiconductor substrate W to output an electric signal. The sensor 30 sends the electric signal to the control arithmetic unit 60. The sensor 30, such as an optical sensor or a pressure sensor, may be integrally formed with the chuck pin 20.

The elevator mechanism 40 is capable of changing the height of the chuck pin 20. For example, the elevator mechanism 40 may be a screw mechanism. In this case, the elevator shaft 23 is formed like a bolt having threads and grooves, and the elevator mechanism 40 is formed like a nut corresponding to the elevator shaft 23. The motor 50 rotates the nut of the elevator mechanism 40 to expand or contract the elevator shaft 23 in the vertical direction. In this way, the length of the elevator shaft 23 protruding from the upper surface of the stage 10 is changed to adjust the height H of the first and second supports 21 and 22.

The elevator mechanism 40 is not limited to the screw mechanism, but may, for example, be a pneumatic or hydraulic pump. In this case, with the operation of the pump, the elevator mechanism 40 adjusts the height H of the first and second supports 21 and 22. When the elevator mechanism 40 is the pneumatic or hydraulic pump, the motor 50 is not required.

The motor 50 drives the elevator mechanism 40 to change the height H of the first and second supports 21 and 22. The motor 50 may be configured as a servo motor together with the control arithmetic unit 60.

The sensor 30, the elevator mechanism 40, and the motor 50 are provided for each of the plurality of chuck pins 20. Therefore, the sensor 30 can detect the edge of the semiconductor substrate W for each chuck pin 20. The elevator mechanism 40 and the motor 50 can change the height H of the first support 21 for each chuck pin 20.

The control arithmetic unit 60 controls the elevator mechanism 40 to change the height H of the first support 21 of each of or a part of the plurality of chuck pins 20 so that the sensor 30 of each of or the part of the chuck pins 20 can detect the edge of the semiconductor substrate W. For this reason, the control arithmetic unit 60 is provided to be shared by all of or a part of the plurality of chuck pins 20, to receive a detection result from the sensor 30 of each of or the part of the chuck pins 20 to control the corresponding motor 50. As described, the control arithmetic unit 60 receives feedback from the sensors 30 to control the motors 50. The control arithmetic unit 60 may feedback-control the motor(s) 50 in real time before or during the processing of the semiconductor substrate W.

For example, when the edge of the semiconductor substrate W is detected on the support face F21 for all of the chuck pins 20, the semiconductor substrate W is normally chucked by all of the chuck pins 20. Therefore, without driving the motors 50, the control arithmetic unit 60 keeps the current height H of each first support 21.

Figure 3:
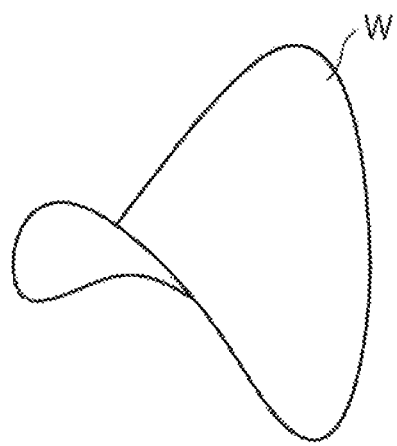
FIG. 3 is an illustration showing an example of a warped semiconductor substrate W.

On the other hand, when the edge of the semiconductor substrate W is not present on the support face F21 in some of the chuck pins 20, the semiconductor substrate W may be warped (bent). In this case, the semiconductor substrate W may not be normally chucked by the chuck pins 20. For example, FIG. 3 is an illustration showing an example of a warped semiconductor substrate W. FIG. 3 is an exaggerated figure for easy understanding of the warpage of the semiconductor substrate W. When such a warped semiconductor substrate W is placed on the stage 10, its edge floats above the support face F21 of a part of the chuck pins 20. Therefore, the sensors 30 of the part of the chuck pins 20 cannot detect the edge of the semiconductor substrate W. Since such a warped semiconductor substrate W cannot be normally chucked by the chuck pins 20, when the process starts, the semiconductor substrate W may be detached from the chuck pins 20 to fly out, chipped off or damaged inside the chamber 2. Moreover, a warped semiconductor substrate W may have contact with the upper surface of the stage 10. In this case, the semiconductor substrate W may be damaged, cracked or destroyed.

In the cleaning apparatus 1 according to the present embodiment, the control arithmetic unit 60 feedback-controls the motors 50 while receiving signals from the sensors 30 that are not detecting the semiconductor substrate W, to adjust the height H of the chuck pins 20 so as to match the degree of warpage of the semiconductor substrate W.

Figure 4:
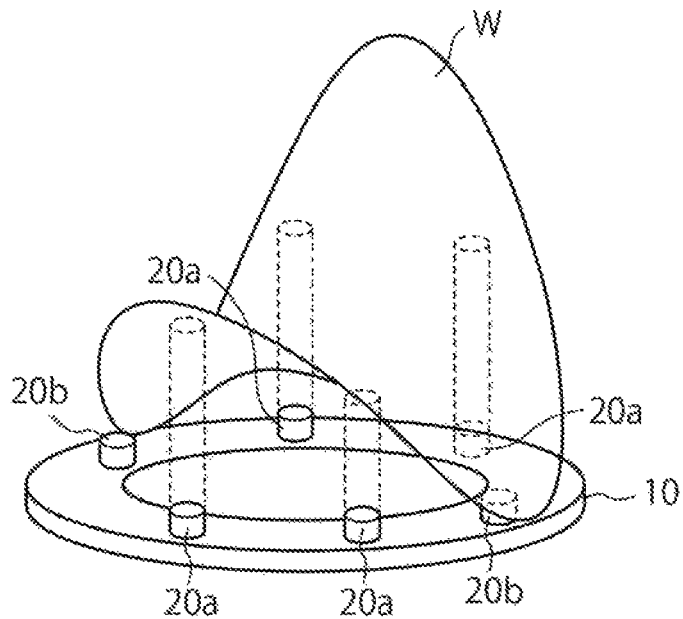
FIG. 4 is a conceptual illustration of height adjustments to chuck pins 20.

FIG. 4 is a conceptual illustration of height adjustments to the chuck pins 20. The chuck pins 20 that are not detecting and are detecting the semiconductor substrate W are denoted as 20a and 20b, respectively.

In response to the signals from the sensors (first sensor) 30 of the chuck pins 20a that are not detecting the edge of the semiconductor substrate W, the control arithmetic unit 60 feedback-controls the motors 50 to raise the chuck pins 20a. The state where the chuck pins 20a are being raised is shown with broken lines in FIG. 4. Thereafter, at the moment at which or just after that the sensors 30 of the chuck pins 20a detect the edge of the semiconductor substrate W, the control arithmetic unit 60 stops driving of the motors 50 corresponding to the chuck pins 20a. In this way, without the semiconductor substrate W being floated above the other chuck pins 20b, the edge of the semiconductor substrate W can be brought into contact with the support faces F21 of the chuck pins 20a.

Although not shown, in response to the signals from the sensors 30 of the chuck pins 20a that are not detecting the edge of the semiconductor substrate W, the control arithmetic unit 60 may feedback-control the motors 50 corresponding to the sensors (second sensor) 30 of the chuck pins 20b that are detecting the edge of the semiconductor substrate W, to lower the chuck pins 20b. In this case, as the chuck pins 20b are lowered, the semiconductor substrate W is gradually lowered, and at the moment at which or just after that the sensors 30 of the chuck pins 20a detect the edge of the semiconductor substrate W, the control arithmetic unit 60 stops driving of the motors 50 corresponding to the chuck pins 20b. In this way, without the semiconductor substrate W being floated above the chuck pins 20b, the edge of the semiconductor substrate W can be brought into contact with the support faces F21 of the chuck pins 20a.

Subsequently, a cleaning method using the cleaning apparatus 1 according to the present embodiment will be explained.

Figure 5:
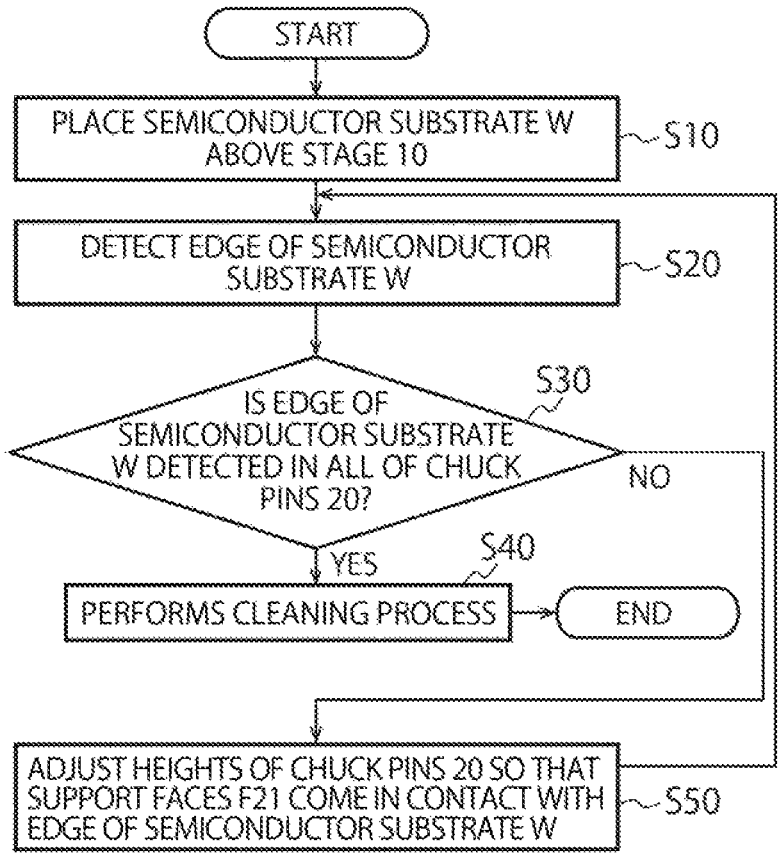
FIG. 5 is a flowchart showing an example of a cleaning method according to the present embodiment.

FIG. 5 is a flowchart showing an example of the cleaning method according to the present embodiment.

Firstly, the semiconductor substrate W is transferred into the chamber 2 and placed above the stage 10 (S10). In this step, the chuck pins 20 are set at almost the same height, on which the semiconductor substrate W is placed.

Subsequently, in each chuck pin 20, the sensor 30 detects the edge of the semiconductor substrate W (S20). If the semiconductor substrate W is warped, the edge of the semiconductor substrate W is floated above a part of the chuck pins 20. In this case, as described later, the sensors 30 cannot detect the edge of the semiconductor substrate W in that part of the chuck pins 20.

For example, when the sensor 30 detects the edge of the semiconductor substrate W in all of the chuck pins 20 (YES in S30), the control arithmetic unit 60 performs a cleaning process while rotating the semiconductor substrate W, without changing the height of the chuck pins 20 (S40). In this step, since all of the sensors 30 detect the edge of the semiconductor substrate W, the second supports 22 correctly hold (chuck) the side surface (bevel) of the semiconductor substrate W. Therefore, it is considered that no problem occurs when the cleaning process is performed.

On the other hand, if the sensors 30 do not detect the edge of the semiconductor substrate W, in a part of the chuck pins 20 (NO in S30), the edge of the semiconductor substrate W may be floated, in that part of the chuck pins 20. Therefore, while receiving signals of the sensors 30, the control arithmetic unit 60 feedback-controls the motors 50 to adjust the heights of the chuck pins 20 so that the support faces F21 come in contact with the edge of the semiconductor substrate W (S50).

For example, in response to the signals from the sensors 30 that are not detecting the edge of the semiconductor substrate W, the control arithmetic unit 60 raises the chuck pins 20 corresponding to those sensors 30. Thereafter, at the moment at which or just after that the sensors 30 detect the edge of the semiconductor substrate W, the control arithmetic unit 60 stops driving of the motors 50. In this way, the edge of the semiconductor substrate W can be brought into contact with the support faces F21 of the chuck pins 20.

Conversely, in response to the signals from the sensors 30 that are not detecting the edge the semiconductor substrate W, the control arithmetic unit 60 may lower the chuck pins 20 corresponding to the sensors 30 that are detecting the edge the semiconductor substrate W. In this case, since the sensors 30 that are detecting the edge the semiconductor substrate W are lowered, the semiconductor substrate W is gradually lowered in accordance with the lowering of the chuck pins 20. Thereafter, at the moment at which or just after that the sensors 30 detect the edge of the semiconductor substrate W, the control arithmetic unit 60 stops driving of the motors 50. In this way, the edge of the semiconductor substrate W can be brought into contact with the support faces F21 of the chuck pins 20 that are not detecting the edge of the semiconductor substrate W.

However, when the chuck pins 20 are lowered, the semiconductor substrate W may have contact with the upper surface of the stage 10 due to the warpage of the semiconductor substrate W. Therefore, it is preferable that the control arithmetic unit 60 lowers the chuck pins 20 when the support faces F21 of the chuck pins 20 are located at a much higher position or the height the support faces F21 is close to the upper limit, so that the support faces F21 cannot be raised further.

As described above, after the semiconductor substrate W comes in contact, at the edge thereof, with the support faces F21 of all chuck pins 20 (YES in S30), the cleaning apparatus 1 performs the cleaning process (S40). While repeating the steps S20 to S50 during the cleaning process, the cleaning apparatus 1 adjusts the height of the chuck pins 20 in real time.

The cause of warpage of the semiconductor substrate W is mostly the stress from a material formed as a film on the semiconductor substrate W. Therefore, the warpage of the semiconductor substrate W may change during the processing when the material on the semiconductor substrate W is removed by cleaning or etching, or when the material is formed as a film on the semiconductor substrate W. In order to deal with such change in warpage of the semiconductor substrate W during the processing, the control arithmetic unit 60 feedback-controls the motors 50 in real time before or during the processing of the semiconductor substrate W, as described above. Accordingly, the support faces F21 of the chuck pins 20 can follow the edge of the semiconductor substrate W in real time to support the edge thereof.

The control arithmetic unit 60 may control the chuck pins 20 separately. However, the control arithmetic unit 60 may perform the same control per group of chuck pins 20. For example, the control arithmetic unit 60 may simultaneously perform the same control per group of two chuck pins 20 next to each other. Or the control arithmetic unit 60 may simultaneously perform the same control to two chuck pins 20 that face each other, with the center of the upper surface of the stage 10 located therebetween. The warpage of the semiconductor substrate W is mostly roughly symmetrical about the center of the stage 10. Therefore, it is effective to drive a plurality of chuck pins 20 next to or facing each other at the same time and in the same way.

As described above, the cleaning apparatus 1 according to the present embodiment can correctly chuck the semiconductor substrate W with the chuck pins 20, irrespective of the warped shape of the semiconductor substrate W or the amount of warpage thereof. Moreover the chuck pins 20 can follow the edge of the semiconductor substrate W in real time during the cleaning process, under feedback control, to support the semiconductor substrate W. Accordingly, the cleaning apparatus 1 can process the semiconductor substrate W while rotating the semiconductor substrate W in a normal way, even if the semiconductor substrate W is warped.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor processing apparatus comprising:
a stage capable of placing a semiconductor substrate thereon and of rotating the semiconductor substrate;
a plurality of holders provided on the stage, the holders respectively have a first support roughly parallel with a surface of the semiconductor substrate to support edges of the semiconductor substrate from below and a second support roughly orthogonal to the surface of the semiconductor substrate to support side faces of the semiconductor substrate;
a plurality of sensors provided to the plurality of holders, respectively, the sensors detecting the edge of the semiconductor substrate;
an elevator mechanism capable of changing heights of the holders; and
a controller controlling the elevator mechanism to change the heights of the holders so that all of the sensors detect the edge of the semiconductor substrate and so that all of the holders chuck the edges of the semiconductor substrate.

2. The semiconductor processing apparatus according to claim 1, wherein the plurality of holders comprise:
a first support supporting the edge of the semiconductor substrate from below; and
a second support supporting the edge of the semiconductor substrate laterally.

3. The semiconductor processing apparatus according to claim 2, wherein the plurality of sensors detect the edge of the semiconductor substrate while the stage is rotating the semiconductor substrate, and
the controller controls the heights of the holders while the stage is rotating the semiconductor substrate.

4. The semiconductor processing apparatus according to claim 2, wherein, when a first sensor among the plurality of sensors does not detect the edge of the semiconductor substrate, the controller lowers downward a holder among the holders which has a second sensor detecting the edge of the semiconductor substrate among the plurality of sensors.

5. The semiconductor processing apparatus according to claim 1, wherein the plurality of sensors detect the edge of the semiconductor substrate while the stage is rotating the semiconductor substrate, and
the controller changes the heights of the holders while the stage is rotating the semiconductor substrate.

6. The semiconductor processing apparatus according to claim 5, wherein, when a first sensor among the plurality of sensors does not detect the edge of the semiconductor substrate, the controller lowers downward a holder among the holders which has a second sensor detecting the edge of the semiconductor substrate among the plurality of sensors.

7. The semiconductor processing apparatus according to claim 1, wherein the plurality of sensors are an optical sensor radiating light and detecting reflected light reflected on the edge of the semiconductor substrate.

8. The semiconductor processing apparatus according to claim 1, wherein the plurality of sensors are a pressure sensor detecting pressure caused by a weight of the semiconductor substrate.

9. The semiconductor processing apparatus according to claim 1, wherein, when a first sensor among the plurality of sensors does not detect the edge of the semiconductor substrate, the controller lowers downward a holder among the holders which has a second sensor detecting the edge of the semiconductor substrate among the plurality of sensors.

10. The semiconductor processing apparatus according to claim 9, wherein, when the first sensor detects the edge of the semiconductor substrate, the controller stops lowering of the holder having the second sensor.

11. The semiconductor processing apparatus according to claim 1, wherein, when a first sensor does not detect the edge of the semiconductor substrate, the controller raises a holder among the holders which has the first sensor.

12. The semiconductor processing apparatus according to claim 11, wherein, when the first sensor detects the edge of the semiconductor substrate, the controller stops raising of the holder having the first sensor.

* * * * *